(12) United States Patent
Yoshikawa et al.

(10) Patent No.: US 9,601,643 B2
(45) Date of Patent: Mar. 21, 2017

(54) PHOTOELECTRIC CONVERSION ELEMENT

(71) Applicants: Sharp Kabushiki Kaisha, Osaka-shi, Osaka (JP); The University of Tokyo, Bunkyo-ku, Tokyo (JP)

(72) Inventors: Hirofumi Yoshikawa, Osaka (JP); Makoto Izumi, Osaka (JP); Yasuhiko Arakawa, Bunkyo-ku (JP)

(73) Assignees: Sharp Kabushiki Kaisha, Sakai (JP); THE UNIVERSITY OF TOKYO, Tokyo (JP)

( * ) Notice: Subject to any disclaimer, the term of this patent is extended or adjusted under 35 U.S.C. 154(b) by 0 days.

(21) Appl. No.: 15/165,103

(22) Filed: May 26, 2016

(65) Prior Publication Data

US 2017/0025558 A1    Jan. 26, 2017

(30) Foreign Application Priority Data

Jun. 2, 2015  (JP) .................................. 2015-112452

(51) Int. Cl.

| | | |
|---|---|---|
| H01L 29/06 | (2006.01) |
| H01L 31/0352 | (2006.01) |
| H01L 31/072 | (2012.01) |
| H01L 31/055 | (2014.01) |
| H01L 31/0232 | (2014.01) |
| H01L 31/109 | (2006.01) |
| H01L 31/054 | (2014.01) |

(52) U.S. Cl.
CPC ............... *H01L 31/035236* (2013.01); *H01L 31/02322* (2013.01); *H01L 31/02327* (2013.01); *H01L 31/055* (2013.01); *H01L 31/0547* (2014.12); *H01L 31/072* (2013.01); *H01L 31/109* (2013.01)

(58) Field of Classification Search
CPC ........... H01L 31/0547; H01L 31/02322; H01L 31/02327; H01L 31/055; H01L 31/072
USPC ................................ 257/14, 15, 17, E29.071
See application file for complete search history.

(56) References Cited

U.S. PATENT DOCUMENTS

2015/0364628 A1* 12/2015 Nozawa .............. H01L 31/0304
                                                                    136/255

FOREIGN PATENT DOCUMENTS

JP          2014-22499 A      2/2014

OTHER PUBLICATIONS

Martí et al. "Production of Photocurrent due to Intermediate-to-Conduction-Band Transitions: A Demonstration of a Key Operating Principle of the Intermediate-Band Solar Cell", Physical Review Letters, vol. 97, Dec. 15, 2006, pp. 247701-1 to 247701-4.

(Continued)

*Primary Examiner* — Tan N Tran
(74) *Attorney, Agent, or Firm* — Keating & Bennett, LLP

(57) ABSTRACT

A photoelectric conversion element includes a superlattice semiconductor layer including barrier sub-layers and quantum sub-layers (quantum dot sub-layers) alternately stacked and also includes a wavelength conversion layer containing a wavelength conversion material converting the wavelength of incident light. The wavelength conversion layer converts incident light into light with a wavelength corresponding to an optical transition from a quantum level of the conduction band of the superlattice semiconductor layer to a continuum level of the conduction band.

9 Claims, 12 Drawing Sheets

(56) References Cited

OTHER PUBLICATIONS

Tomic, "Intermediate-Band Solar Cells: Influence of Band Formation on Dynamical Processes in InAs/GaAs Quantum Dot Arrays", Physical Review B, vol. 82, Nov. 19, 2010, pp. 195321-1 to 195321-15.

* cited by examiner

PHOTOELECTRIC CONVERSION ELEMENT

BACKGROUND

1. Field

The present disclosure relates to a photoelectric conversion element.

2. Description of the Related Art

A great deal of research and development has been carried out on solar cells for the purpose of increasing the photoelectric conversion efficiency using light in a wider wavelength range. For example, *Physical Review Letters*, vol. 97, p. 247701, 2006 (hereinafter referred to as the "non-patent document") proposes a solar cell that can photoexcite electrons in two steps to use light with a long wavelength in such a manner that a superlattice miniband is formed between the valence band and conduction band of a base material.

The solar cell has quantum dots as disclosed in the non-patent document and has a structure in which a quantum dot layer having quantum dots is inserted in a compound solar cell. Such a structure enables the absorption of light in an unused wavelength range (the absorption of a photon with an energy less than the band gap of a base material) by two-step photoexcitation through quantum levels and enables a photocurrent to be increased. In the case where a superlattice miniband is formed by electronic bonding between quantum dots, carriers generated in the quantum dots migrate in the superlattice miniband to p-type and n-type base semiconductor regions by photoexcitation and are extracted outside.

At present, in a solar cell including a quantum dot layer, the extraction efficiency of carriers generated in the quantum dot layer is very low and therefore the photoelectric conversion efficiency is low. A cause of this is probably the fact that the efficiency of two-step light absorption through quantum levels (including a superlattice miniband) is low. In particular, in two-step light absorption, an absorption band from a quantum level corresponding to the second light absorption to a conduction band is narrower than an absorption band from a valence band corresponding to the first light absorption to a quantum level and the match between the second light absorption band and the spectrum of sunlight is low. Therefore, there is a problem in that the second light absorption is insufficient, although the first light absorption is sufficient.

Research and development has been also carried out to increase the efficiency of solar cells by the use of wavelength conversion materials. Japanese Unexamined Patent Application Publication No. 2014-22499 (hereinafter referred to as the "patent document") describes that the wavelength range of light capable of being photoelectrically converted is expanded in such a manner that light in a wavelength region between two light absorption peaks causing transmission loss is wavelength-converted into light with a light absorption peak on the longer wavelength side, whereby the increase of the photoelectric conversion efficiency is attempted. However, the patent document does not disclose that incident light is converted into light with a wavelength corresponding to an optical transition from a quantum level corresponding to the second light absorption to a conduction band using a wavelength conversion material in order to increase the photoelectric conversion efficiency.

SUMMARY

An embodiment of the present disclosure provides a technique for increasing the photoelectric conversion efficiency of a photoelectric conversion element.

A photoelectric conversion element according to an embodiment of the present disclosure includes a superlattice semiconductor layer including barrier sub-layers and quantum sub-layers alternately stacked and also includes a wavelength conversion layer containing a wavelength conversion material converting the wavelength of incident light. The wavelength conversion layer converts incident light into light with a wavelength corresponding to an optical transition from a quantum level of the conduction band of the superlattice semiconductor layer to a continuum level of the conduction band.

DESCRIPTION OF THE EMBODIMENTS

Figure 1:
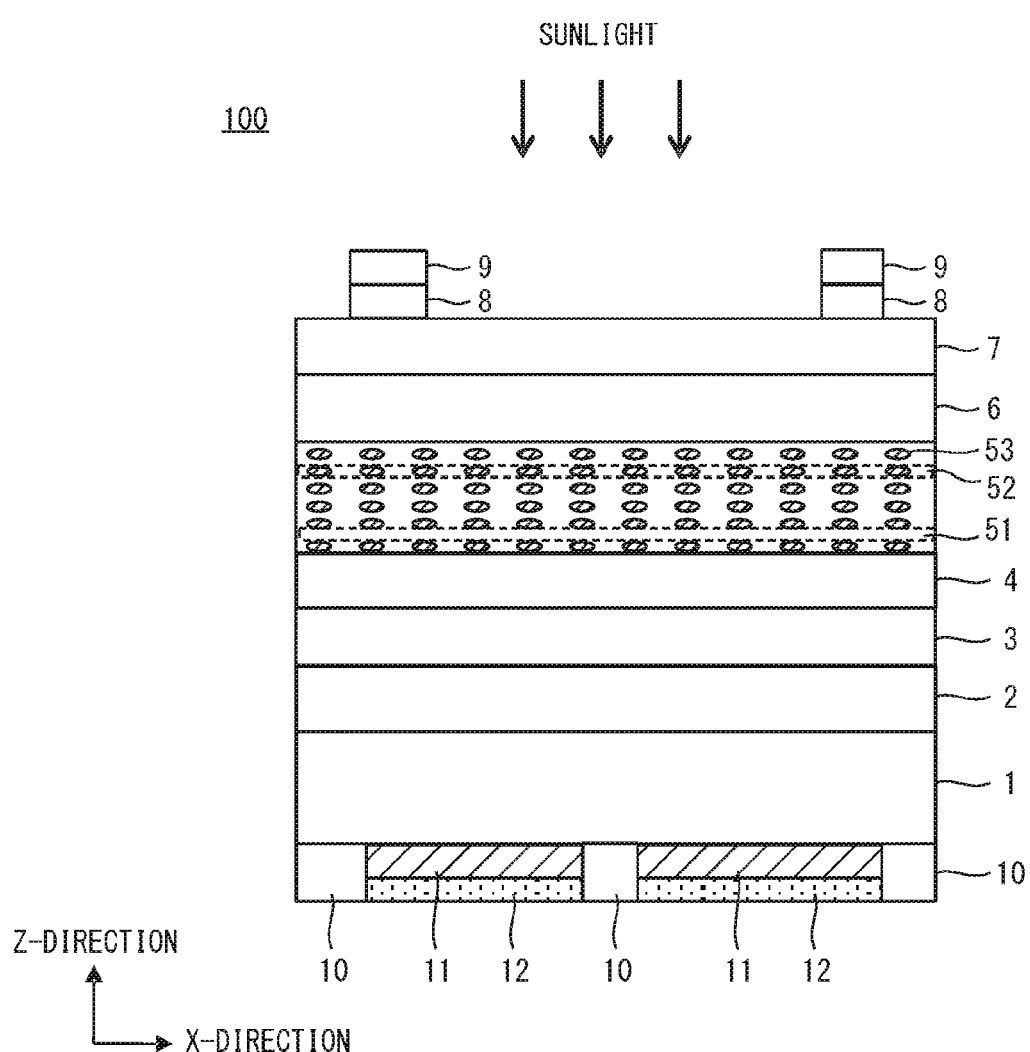
FIG. 1 is a schematic sectional view showing the configuration of a solar cell according to an embodiment.

A photoelectric conversion element according to an embodiment of the present disclosure includes a superlattice semiconductor layer including barrier sub-layers and quantum sub-layers alternately stacked and also includes a wavelength conversion layer containing a wavelength conversion material converting the wavelength of incident light. The wavelength conversion layer converts incident light into light with a wavelength corresponding to an optical transition from a quantum level of the conduction band of the superlattice semiconductor layer to a continuum level of the conduction band (a first configuration).

According to the first configuration, the photoelectric conversion efficiency can be increased by efficiently inducing the second light absorption in two-step light absorption through quantum levels.

In the first configuration, the wavelength conversion layer can convert incident light into light with an energy at which a light absorption coefficient peaks in response to the optical transition from the quantum level of the conduction band of the superlattice semiconductor layer to the continuum level of the conduction band in a light absorption spectrum showing the relationship between the energy of light and the light absorption coefficient (a second configuration).

According to the second configuration, since incident light is converted into light with an energy at which the light absorption coefficient peaks in response to the optical transition from the quantum level of the conduction band of the superlattice semiconductor layer to the continuum level of the conduction band, the second light absorption in two-step light absorption through quantum levels can be effectively induced and therefore the photoelectric conversion efficiency can be increased.

In the second configuration, the wavelength conversion layer may convert incident light into light with an energy at which the light absorption coefficient is largest among energies at which the light absorption coefficient peaks in response to optical transitions from quantum levels of the conduction band of the superlattice semiconductor layer to the continuum level of the conduction band in the light absorption spectrum (a third configuration).

According to the third configuration, since incident light is converted into light with an energy at which the light absorption coefficient is largest among energies at which the light absorption coefficient peaks in response to the optical transitions from the quantum levels of the conduction band of the superlattice semiconductor layer to the continuum level of the conduction band, the photoelectric conversion efficiency can be increased by efficiently inducing the second light absorption in two-step light absorption through quantum levels.

In any one of the first to third configurations, the wavelength conversion layer may be placed opposite a light-incident side with respect to the superlattice semiconductor layer (a fourth configuration).

According to the fourth configuration, the wavelength conversion layer wavelength-converts light passing through the photoelectric conversion layer to efficiently induce the second light absorption in two-step light absorption and therefore the photoelectric conversion efficiency can be effectively increased.

In the fourth configuration, the photoelectric conversion element may further include a reflective film which is placed opposite the light-incident side with respect to the wavelength conversion layer and which reflects light (a fifth configuration).

According to the fifth configuration, a component of light that is wavelength-converted by the wavelength conversion layer and that is radiated on the side opposite to the light-incident side is reflected by the reflective film and is then incident on the photoelectric conversion layer; hence, the photoelectric conversion efficiency can be increased.

In any one of the first to fifth configurations, the quantum sub-layers may be quantum dot layers having a structure in which a plurality of quantum dots are surrounded by the barrier sub-layers (a sixth configuration).

According to the sixth configuration, the lifetime of excited carriers can be extended by an effect such as light absorption phonon bottleneck.

In any one of the first to sixth configurations, the wavelength conversion material may contain the quantum dots (a seventh configuration).

According to the seventh configuration, the emission peak of wavelength-converted light is an emission peak with a narrow full width at half maximum depending strongly on the density of states and therefore light can be efficiently absorbed.

In any one of the first to seventh configurations, the wavelength conversion layer may include a plurality of sub-layers which convert incident light into light with a shorter wavelength and which contain different types of wavelength conversion materials (an eighth configuration).

According to the eighth configuration, light not wavelength-converted by one of the sub-layers of the wavelength conversion layer that is located on the light-incident side can be wavelength-converted by the sub-layer next to the one or another sub-layer; hence, the photoelectric conversion efficiency can be increased.

In the eighth configuration, at least one of the sub-layers included in the wavelength conversion layer may convert incident light into light with an energy at which a light absorption coefficient peaks in response to an optical transition from a quantum level of the valence band of the superlattice semiconductor layer to a continuum level of the valence band in a light absorption spectrum showing the relationship between the energy of light and the light absorption coefficient (a ninth configuration).

According to the ninth configuration, carriers produced at a quantum level of the valence band of the superlattice semiconductor layer can be efficiently extracted.

Embodiment

The photoelectric conversion element and a solar cell are described below in detail with reference to the attached drawings. In the drawings, the same reference numerals denote the same components or corresponding components. Dimensions such as length, width, thickness, and depth are appropriately modified for the clarification and simplification of the drawings and do not express actual dimensions.

Terms used in this specification are simply described below. The terms are used to describe a configuration in this embodiment and do not limit the present disclosure.

The term "superlattice semiconductor layer" refers to a layer having a superlattice structure composed of barrier sub-layers and quantum sub-layers alternately stacked. The barrier sub-layers and the quantum sub-layers are made of a compound semiconductor material. The barrier sub-layers are higher in band gap energy than the quantum sub-layers.

The term "quantum sub-layers" includes quantum dot sub-layers, quantum nano-wire sub-layers, quantum well sub-layers, and the like. The quantum sub-layers are made of a semiconductor material having a band gap less than that of a semiconductor material forming the barrier sub-layers and have a discrete energy level due to a quantum effect.

The term "barrier sub-layers" refers to layers made of a semiconductor material having a band gap greater than that of the semiconductor material forming the quantum sub-layers. The barrier sub-layers contain no quantum dots when the quantum sub-layers are the quantum dot sub-layers.

The term "superlattice structure" refers to a structure composed of crystal lattices having a periodic structure longer than a primitive unit cell because of the superposition of several types of crystal lattices.

The term "quantum dots" refers to fine semiconductor particles which have a size of about 100 nm or less and which are surrounded by a semiconductor material having a band gap greater than that of a semiconductor material forming the quantum dots.

The term "quantum dot layers" refers to layers containing the quantum dots and a semiconductor material having a band gap greater than that of the semiconductor material forming the quantum dots.

The term "quantum level" refers to a discrete energy level.

The term "miniband" refer to a band formed in such a way that wave functions derived from the quantum dots overlap each other and discrete energy levels of the quantum dots are bundled. At least one portion of the miniband is located between the upper end of the valence band of each barrier sub-layer and the lower end of the conduction band of the barrier sub-layer.

An example of the application of the photoelectric conversion element to the solar cell is described below.

FIG. 1 is a schematic sectional view showing the configuration of a solar cell 100 according to an embodiment. The solar cell 100 includes a substrate 1, a buffer layer 2, a back-surface field (BSF) layer 3, a base layer 4, a superlattice semiconductor layer 5, an emitter layer 6, a window layer 7, contact layers 8, p-type electrodes 9, n-type electrodes 10, wavelength conversion layers 11, and metal films 12.

In particular, the buffer layer 2, the BSF layer 3, and the base layer 4 are placed on the substrate 1 in that order. The superlattice semiconductor layer 5 is placed on the base layer 4. The emitter layer 6 is placed on the superlattice semiconductor layer 5. The window layer 7 is placed on the emitter layer 6. The p-type electrodes 9 are placed above the contact layers 8 therebetween. The n-type electrodes 10 are placed on a surface of the substrate 1 that is opposite to a surface (back surface) of the substrate 1 that is provided with the buffer layer 2. In the surface of the substrate 1 that is provided with the n-type electrodes 10, each of the wavelength conversion layers 11 is placed between the neighboring n-type electrodes 10 and each of the metal films 12 is placed under (on the back side of) a corresponding one of the wavelength conversion layers 11.

Referring to FIG. 1, in the solar cell 100, a side provided with the p-type electrodes 9 is a light-receiving side receiving sunlight. Thus, in this embodiment, a surface of the solar cell 100 that is provided with the p-type electrodes 9 is referred to as the light-receiving surface and a surface of the solar cell 100 that is provided with the n-type electrodes 10 is referred to as the back surface.

The substrate 1 is made of a semiconductor containing an n-type impurity.

The buffer layer 2 is made of, for example, $n^+$-GaAs and has a thickness of, for example, about 100 nm to 500 nm.

The BSF layer 3 is made of, for example, n-$Al_{0.8}Ga_{0.2}As$ and has a thickness of, for example, about 10 nm to 300 nm.

The base layer 4 is made of a semiconductor, such as GaAs, AlGaAs, InGap, GaAsP, AlGaAsSb, AlAsSb, GaAsSb, InAlAs, or ZnTe, containing an n-type impurity. The base layer 4 may be made of a semiconductor material which is the same as that forming barrier sub-layers 51 described below and which is doped with the n-type impurity or may be made of a semiconductor material which is different from that forming the barrier sub-layers 51 and which is doped with the n-type impurity. The concentration of the n-type impurity in the base layer 4 is not particularly limited and may be appropriately set depending on a semiconductor material forming the base layer 4.

The base layer 4 may be a thin film formed by a chemical vapor deposition (CVD) process or a molecular beam epitaxy (MBE) process. The base layer 4 has a thickness of, for example, about 20 nm to 3,000 nm. The thickness of the base layer 4 is not particularly limited and may be appropriately set such that the superlattice semiconductor layer 5 can sufficiently absorb light.

Referring to FIG. 1, the base layer 4 is located opposite the light-incident side with respect to the superlattice semiconductor layer 5. The base layer 4 may be located opposite the light-incident side.

The superlattice semiconductor layer 5 is placed between the base layer 4 and the emitter layer 6. The superlattice semiconductor layer 5 has a superlattice structure in which the barrier sub-layers 51 and quantum dot sub-layers 52 are alternately stacked. The superlattice semiconductor layer 5 has an intermediate energy band (an intermediate energy level) in each of the valence band and conduction band of quantum dots 53. The quantum dot sub-layers 52 are quantum sub-layers and contain the quantum dots 53. The quantum dots 53 are surrounded by the barrier sub-layers 51.

The superlattice semiconductor layer 5 may include insertion sub-layers, such as capping sub-layers and quantum well sub-layers, different in material from the quantum dot sub-layers 52 and the barrier sub-layers 51 such that the insertion sub-layers, the quantum dot sub-layers 52, and the barrier sub-layers 51 are alternately stacked.

A material forming the quantum dot sub-layers 52 and a material forming the barrier sub-layers 51 is not particularly limited and may be a group III-V compound semiconductor. The quantum dot sub-layers 52 may be made of a semiconductor material with a band gap energy less than that of the barrier sub-layers 51. The material forming the quantum dot sub-layers 52 and the material forming the barrier sub-layers 51 may be, for example, $GaAs_xSb_{1-x}$, AlSb, $InAs_xSb_{1-x}$, $Ga_xIn_{1-x}Sb$, $AlSb_xAs_{1-x}$, $AlAs_zSb_{1-z}$, $In_xGa_{1-x}As$, $Al_xGa_{1-x}As$, $Al_yGa_{1-y}As_zSb_{1-z}$, $In_xGa_{1-x}P$, $(Al_yGa_{1-y})_zIn_{1-z}P$, $GaAs_{1-x}P_{1-x}$, $Ga_yIn_{1-y}As_zP_{1-z}$, and/or $In_xAl_{1-x}As$, where $0 \leq x \leq 1$, $0 \leq y \leq 1$, and $0 \leq z \leq 1$. The material forming the quantum dot sub-layers 52 and the material forming the barrier sub-layers 51 may be a mixed crystal material made of some of these compounds.

The material forming the quantum dot sub-layers 52 and the material forming the barrier sub-layers 51 may be a compound semiconductor made of a group IV element, a group III element, and a group V element or a compound semiconductor made of a group II element and a group VI element in the periodic table or a mixed crystal material made of these compound semiconductors. Alternatively, the material forming the quantum dot sub-layers 52 and the material forming the barrier sub-layers 51 may be a chalcopyrite material or a semiconductor other than the chalcopyrite material.

Examples of a combination of a material forming the quantum dots 53 in the quantum dot sub-layers 52 and the material forming the barrier sub-layers 51 include a combination of $In_xGa_{1-x}As$ and GaAs, a combination of $In_xGa_{1-x}As$ and GaNAs, a combination of $In_xGa_{1-x}As$ and $Al_xGa_{1-x}As$, a combination of $In_xGa_{1-x}As$ and $In_xGa_{1-x}P$, a combination of $In_xGa_{1-x}As$ and $Ga_yIn_{1-y}As_zP_{1-z}$, a combination of $Ga_xIn_{1-x}N$ and GaN, a combination of $In_xGa_{1-x}As$ and $Al_yGa_{1-y}As_zSb_{1-z}$, a combination of $In_xGa_{1-x}As$ and $GaAs_xSb_{1-x}$, a combination of $In_xGa_{1-x}As$ and $AlAs_zSb_{1-z}$, a combination of $In_xGa_{1-x}As$ and $Al_xGa_{1-x}Sb$, a combination of $InAs_xSb_{1-x}$ and $GaAs_xSb_{1-x}$, a combination of $InAs_xSb_{1-x}$ and $Al_yGa_{1-y}As_zSb_{1-z}$, a combination of $InAs_xSb_{1-x}$ and $AlAs_zSb_{1-z}$, a combination of $InAs_xSb_{1-x}$ and $Al_xGa_{1-x}Sb$, a combination of InP and $In_xAl_{1-x}As$, a combination of $In_xGa_{1-x}As$ and $In_xAl_{1-x}As$, a combination of $In_xGa_{1-x}As$ and $GaAs_xP_{1-x}$, a combination of $In_xGa_{1-x}As$ and $(Al_yGa_{1-y})_zIn_{1-z}P$, a combination of $InAs_xSb_{1-x}$ and $In_xGa_{1-x}P$, a combination of $InAs_xSb_{1-x}$ and $GaAs_xP_{1-x}$, a combination of $Ga_xIn_{1-x}Sb$ and AlSb, a combination of $CuInSe_2$ and $CuGaS_2$, and a combination of ZnSe and ZnTe, where $0 \le x \le 1$, $0 \le y \le 1$, and $0 \le z \le 1$.

The superlattice semiconductor layer 5 may be an i-type semiconductor layer or may be a semiconductor layer containing a p- or n-type impurity if electromagnetic force is induced by receiving light.

The emitter layer 6 is made of a semiconductor such as GaAs, AlGaAs, InGap, GaAsP, AlGaAsSb, AlAsSb, GaAsSb, InAlAs, or ZnTe, containing a p-type impurity. The emitter layer 6 may be made of the semiconductor material which is the same as that forming barrier sub-layers 51 and which is doped with the p-type impurity or may be made of a semiconductor material which is different from that forming the barrier sub-layers 51 and which is doped with the p-type impurity. The concentration of the n-type impurity in the emitter layer 6 is not particularly limited and may be appropriately set depending on the semiconductor material forming the emitter layer 6.

The emitter layer 6 may be a thin film formed by a CVD process or an MBE process. The emitter layer 6 has a thickness of, for example, about 20 nm to 3,000 nm. The thickness of the emitter layer 6 is not particularly limited and may be appropriately set such that the superlattice semiconductor layer 5 can sufficiently absorb light.

Referring to FIG. 1, the emitter layer 6 is located on the light-incident side with respect to the superlattice semiconductor layer 5. The emitter layer 6 may be located opposite the light-incident side.

The emitter layer 6 can form a pin junction or a pn junction (a pn$^-$p junction, a pp$^-$n junction, a p$^+$pn junction, or a pnn$^+$ junction) together with each of the base layer 4 and the superlattice semiconductor layer 5. Receiving light by a configuration having the pin junction or the pn junction induces electromagnetic force. That is, the base layer 4, the superlattice semiconductor layer 5, and the emitter layer 6 form a photoelectric conversion layer converting the energy of incident light into electrical energy.

The window layer 7 is made of, for example, a semiconductor, such as $Al_{0.8}Ga_{0.2}As$, containing a p-type impurity. The window layer 7 has a thickness of, for example, about 10 nm to 300 nm.

The contact layers 8 are made of, for example, a semiconductor, such as p$^+$-GaAs, containing a p-type impurity. The contact layers 8 have a thickness of, for example, about 10 nm to 500 nm.

The p-type electrodes 9 can be formed using, for example, a material combination such as Ti/Pt/Au, Au/Zn, Au/Cr, Ti/Au, or Au/Zn/Au. The p-type electrodes 9 have a thickness of, for example, about 10 nm to 500 nm.

The n-type electrodes 10 can be formed using, for example, a material combination such as Au/AuGeNi, AuGe/Ni/Au, Au/Ge, or Au/Ge/Ni/Au. The n-type electrodes 10 have a thickness of, for example, about 10 nm to 500 nm.

The wavelength conversion layers 11 are made of, for example, InAsSb and have a thickness of, for example, about 10 nm to 500 nm. Details of the wavelength conversion layers 11 are described below.

The metal films 12 function as reflective films. For example, a high-reflectivity metal material such as Au, Ag, Al, Cu, Ni, Pt, Rh, or Sn is used to form the metal films 12. The same material as that used to form the n-type electrodes 10 can be used to form the metal films 12. For example, a material combination such as Au/AuGeNi, AuGe/Ni/Au, Au/Ge, or Au/Ge/Ni/Au can be used to form the metal films 12. The metal films 12 have a thickness of, for example, about 10 nm to 500 nm.

Wavelength Conversion Layer

The wavelength conversion layers 11 contain a photoelectric conversion material converting the wavelength of incident light and converts the wavelength of light not absorbed by the photoelectric conversion layer. Light entering the wavelength conversion layers 11 is wavelength-converted by the wavelength conversion material and is then delivered from the wavelength conversion layers 11. The light delivered from the wavelength conversion layers 11 enters the photoelectric conversion layer and is photoelectrically converted.

In this embodiment, the wavelength conversion layers 11 convert incident light into light with a wavelength corresponding to an optical transition from a quantum level of the conduction band of the superlattice semiconductor layer 5 to a continuum level of the conduction band. In particular, the wavelength conversion layers 11 convert incident light into light with an energy at which a light absorption coefficient peaks among energies corresponding to optical transitions from quantum levels of the conduction band of the superlattice semiconductor layer 5 to the continuum level of the conduction band in a light absorption spectrum showing the relationship between the energy of light and the light absorption coefficient.

The energy, E in eV, of light is given by the equation $E = 1240/\lambda$, where $\lambda$ is the wavelength, in nm, of light. Therefore, it can also be expressed that the wavelength conversion layers 11 convert incident light into light with a wavelength at which the light absorption coefficient peaks among wavelengths corresponding to the optical transition from the quantum level of the conduction band of the superlattice semiconductor layer 5 to the continuum level of the conduction band in the light absorption spectrum showing the relationship between the energy of light and the light absorption coefficient. Hereinafter, in similar expressions, the term "energy" can be replaced with the term "wavelength".

Figure 2A:
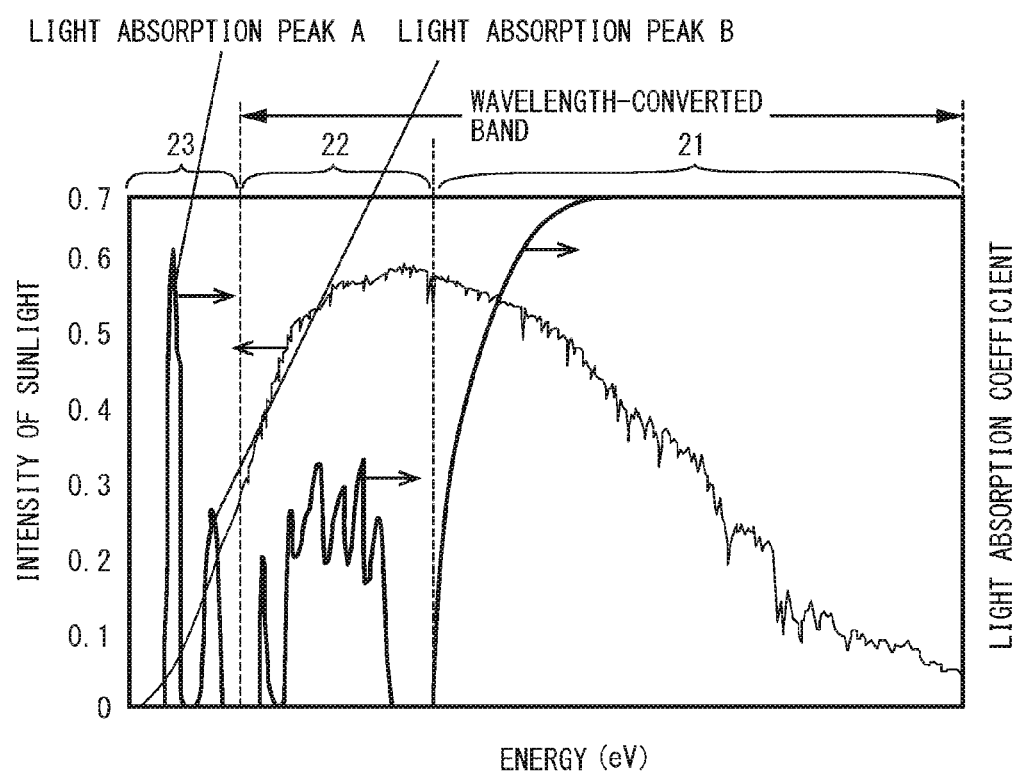
FIG. 2A is a graph showing the intensity of sunlight and an example of a light absorption spectrum.

FIG. 2A is a graph showing the intensity of sunlight and an example of a light absorption spectrum. In FIG. 2A, the intensity of sunlight is drawn with a thin line and the light absorption spectrum is drawn with a thick line.

In the configuration of the solar cell 100, the light absorption spectrum is roughly divided into three: a light absorption spectrum 21 between bulks (between a valence band and a conduction band), a first light absorption spectrum 22 in two-step light absorption through quantum levels (including a superlattice miniband), and a second light absorption spectrum 23 in two-step light absorption.

Figure 2B:
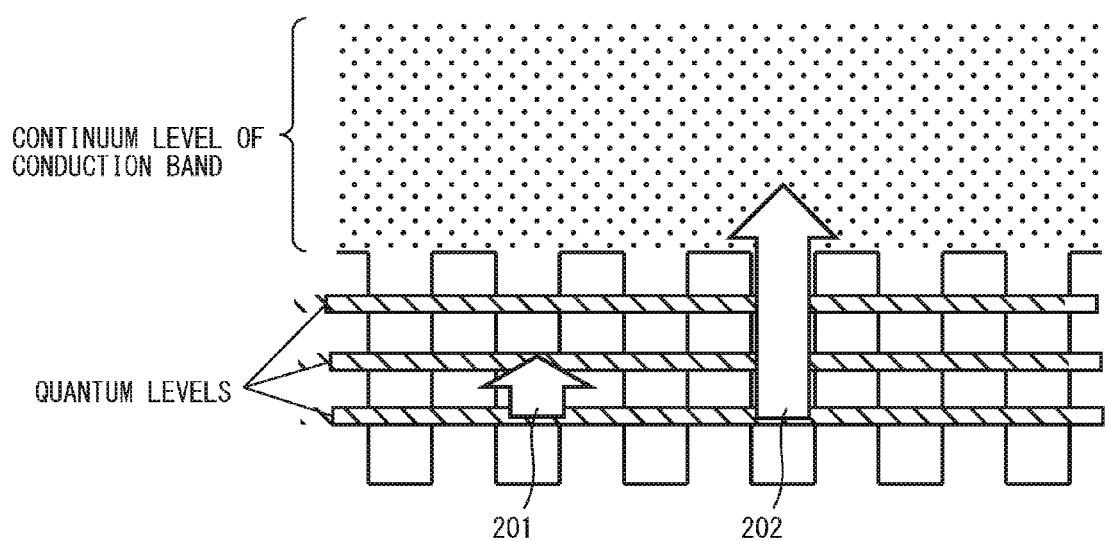
FIG. 2B is an illustration showing an optical transition between quantum levels and an optical transition from a quantum level to a conduction band.

As shown in FIG. 2A, the second light absorption spectrum 23 in two-step light absorption contains a light absorption peak A where a light absorption coefficient peaks in response to an optical transition between quantum levels (including a superlattice miniband) and a light absorption peak B where the light absorption coefficient peaks in response to an optical transition from a quantum level (including a superlattice miniband) to a conduction band. FIG. 2B shows an optical transition 201 corresponding to the light absorption peak A and an optical transition 202 corresponding to the light absorption peak B.

The wavelength conversion layers 11 wavelength-convert light which includes the light absorption spectrum 21 between the bulks and the first light absorption spectrum 22 in two-step light absorption, which has an energy higher than the emission energy of the wavelength conversion layers 11, and which reaches the wavelength conversion layers 11 into light with an energy equal to that of the light absorption peak B, which corresponds to light absorption from a quantum level to a conduction band. The wavelength conversion layers 11 may convert incident light into light with the largest light absorption peak (the light absorption coefficient is largest) among light absorption peaks corresponding to an optical transition from a quantum level of the conduction band of the superlattice semiconductor layer 5 to a continuum level of the conduction band.

A light absorption peak includes not only a region where the light absorption coefficient is largest but the periphery thereof.

As shown in FIG. 1, the wavelength conversion layers 11 are placed under the lower surface (the side opposite to the light-incident side) of the photoelectric conversion layer. Therefore, the wavelength conversion layers 11 wavelength-convert only sunlight passing through the photoelectric conversion layer; hence, the photoelectric conversion efficiency can be increased. However, the wavelength conversion layers 11 may be placed on or above the upper surface (the light-incident side) of the photoelectric conversion layer. In this case, the wavelength conversion layers 11 may wavelength-convert light not absorbed by the photoelectric conversion layer.

The wavelength conversion material, which is contained in the wavelength conversion layers 11, may be any material capable of converting the wavelength of sunlight and is, for example, InAs, GaAs, AlAs, InSb, GaSb, AlSb, InP, GaP, AlP, ZnO, ZnS, ZnSe, ZnTe, CdS, CdSe, CdTe, PbS, PbSe, PbTe, CuInS, CuGaS, CuInSe, CuGaSe, CuS, InGaZnO, InN, GaN, AlN, Si, Ge, or the like. Alternatively, the wavelength conversion material may be an inorganic material corresponding to a material mixture of these compounds, a complex material, glass containing a rare-earth ion or a transition element, an Er-doped garnet crystal (YAG), an organic material, or the like. These materials may be used in combination with a plurality of materials such as core-shell structures and core-shell-shell structures.

The wavelength conversion material may be used in a size sufficient to induce a quantum effect and may be a quantum dot. The use of a phosphor semiconductor with a size sufficient to induce a quantum effect enables a band gap to be freely tuned and also enables an absorption wavelength range and an emission wavelength range to be freely controlled.

The mixed crystal ratio and/or size of the wavelength conversion material may be appropriately selected depending on the second light absorption spectrum of the superlattice semiconductor layer 5 in two-step light absorption. The wavelength conversion layers 11 may contain a plurality of wavelength conversion materials with different sizes.

Each wavelength conversion layer 11 is not limited to a single layer made of a single type of wavelength conversion material and may include a plurality of sub-layers containing different wavelength conversion materials. That is, the wavelength conversion materials contained in the sub-layers are different in type. In this case, each of the sub-layers of the wavelength conversion layer 11 contains a corresponding one of the wavelength conversion materials that convert incident light into light with a shorter wavelength. That is, one of the sub-layers of the wavelength conversion layer 11 that is located closest to the light-incident side converts incident light into light with the shortest wavelength. This enables light not wavelength-converted by some of the sub-layers of the wavelength conversion layer 11 that are located on the upper side (the light-incident side) to be wavelength-converted by some located on the lower side. Therefore, the photoelectric conversion efficiency can be increased.

When the wavelength conversion layers 11 each include the sub-layers, which contain the different wavelength conversion materials, at least one of the sub-layers may convert incident light into light with an energy at which the light absorption coefficient peaks among energies corresponding to optical transitions from quantum levels of the valence band of the superlattice semiconductor layer 5 to the continuum level of the valence band. When the offset of the valence band of the superlattice semiconductor layer 5 is large, carriers produced at a quantum level of the valence band can be efficiently extracted.

The wavelength conversion layers 11 may contain the wavelength conversion material in such a state that the wavelength conversion material is contained in resin, glass, or the like.

The metal films 12 are placed on the back side of the wavelength conversion layers 11. This allows a component of light that is wavelength-converted by the wavelength conversion layers 11 and that is radiated on the back side thereof is reflected by the metal films 12 and is then incident on the photoelectric conversion layer. Therefore, the photoelectric conversion efficiency can be increased.

The following reason is described below: the reason why the energy of light wavelength-converted by the wavelength conversion layers 11 is matched to light with an energy at which the light absorption coefficient peaks among energies corresponding to optical transitions from quantum levels of the conduction band of the superlattice semiconductor layer 5 to the continuum level of the conduction band in a light absorption spectrum showing the relationship between the energy of light and the light absorption coefficient.

In the case of a superlattice semiconductor layer containing common quantum dots, a subband light absorption spectrum due to optical transitions from quantum levels of the conduction band contains light absorption peaks corresponding to optical transitions between quantum levels of the conduction band and a light absorption peak corresponding to an optical transition from a quantum level of the conduction band to a continuum level of the conduction band from the low-energy side. Unlike a light absorption spectrum of a common bulk semiconductor absorbing light with an energy higher than an energy gap, this is a light absorption spectrum containing a plurality of sharp light absorption peaks due to discrete levels induced by quantum confinement.

That is, even among components of light that have energies greater than the energy gap between a quantum level and continuum level of the conduction band, only components of light that have energies corresponding to the above absorption peaks are absorbed. Thus, in this embodiment, the wavelength conversion layers 11 convert incident light into light with an energy at which a light absorption coefficient peaks among energies corresponding to optical transitions from quantum levels of the conduction band of the superlattice semiconductor layer 5 to the continuum level of the conduction band in a light absorption spectrum showing the relationship between the energy of light and the light absorption coefficient.

In the case where carriers subjected to an optical transition to a quantum level of the conduction band are extracted through electrodes, the carriers need to be further excited over the potential energy of the barrier sub-layers 51 before the carriers are relaxed. In actual solar cells, this is difficult and the extraction efficiency of carriers is low. However, the carriers subjected to the optical transition to the quantum level of the conduction band need not be further excited and are readily extracted through electrodes. That is, even in the absorption of wavelength-converted light, the extraction efficiency of carriers is low when light absorption is due to an optical transition to a quantum level of the conduction band.

In this embodiment, the solar cell 100 effectively uses sunlight resulting in transmission loss for the second photoexcitation in two-step light absorption and can remarkably increase the extraction efficiency of carries photoexcited in the second step in such a manner that the energy of light wavelength-converted by the wavelength conversion layers 11 is matched to the energy of light that allows the light absorption coefficient to peak in response to optical transitions from quantum levels of the conduction band of the superlattice semiconductor layer 5 to the continuum level of the conduction band. Thus, two-step light absorption occurs efficiently. Therefore, the short-circuit current and the open-circuit voltage can be increased and the photoelectric conversion efficiency can be increased.

The superlattice semiconductor layer 5 has a superlattice structure in which the barrier sub-layers 51 and the quantum dot sub-layers 52, which contain the quantum dots 53, are alternately stacked. Since the quantum sub-layers are the quantum dot sub-layers 52, the lifetime of excited carriers can be extended by an effect such as light absorption phonon bottleneck. In the case where quantum dots are used as the wavelength conversion material in the wavelength conversion layers 11, an emission peak and absorption peak with a narrow full width at half maximum depending strongly on the density of states are obtained and therefore light can be efficiently absorbed.

From the above reason, two-step light absorption is incapable of being efficiently induced by simply combining a solar cell including an existing superlattice semiconductor layer with an existing wavelength conversion layer. The followings need to be appropriately controlled such that the energy gap between a quantum level of the conduction band of the superlattice semiconductor layer 5 and a continuum level of the conduction band coincides with the band gap of the wavelength conversion material, which is contained in the wavelength conversion layers 11: materials in the barrier sub-layers 51 and the quantum sub-layers, which form the superlattice semiconductor layer 5; the thickness of the barrier sub-layers 51 and the quantum sub-layers (including the shape and size of the quantum dots 53 when the quantum sub-layers are quantum dot sub-layers 52); the composition of the wavelength conversion material (including the shape and size of the quantum dots 53 when the quantum sub-layers are quantum dot sub-layers 52); and/or the like.

In this embodiment, the solar cell 100 may be combined with a light-collecting system.

Example of Method for Manufacturing Solar Cell

An example of a method for manufacturing the solar cell 100 is described below.

First, the substrate 1 is supported in a molecular beam epitaxy (MBE) system. The substrate 1 is made of n-GaAs.

Next, the buffer layer 2 is formed on the substrate 1. The buffer layer 2 may be an $n^+$-GaAs layer with a thickness of about 300 nm. Forming the buffer layer 2 allows the superlattice semiconductor layer 5 (light-absorbing layer), which is to be formed above the buffer layer 2, to have increased crystallinity. Thus, the solar cell 100 can be provided such that the light absorption efficiency of the superlattice semiconductor layer 5 is ensured.

Thereafter, the BSF layer 3 is formed on the buffer layer 2. The BSF layer 3 may be an n-$Al_{0.8}Ga_{0.2}As$ layer with a thickness of about 50 nm. The base layer 4 is formed on the BSF layer 3. The base layer 4 may be an n-GaAs layer with a thickness of about 2,000 nm.

Subsequently, the superlattice semiconductor layer 5 is formed on the base layer 4 so as to include the barrier sub-layers 51 and the quantum dot sub-layers 52. The superlattice semiconductor layer 5 can be formed by a technique called Stranski-Krastanov (S-K) growth. In particular, for example, after a GaAs layer that is one of the barrier sub-layers 51 is crystallographically grown, the quantum dots 53 are formed from indium arsenide (InAs) by a self-organization mechanism and the same GaAs layer as each barrier sub-layer 51 is crystallographically grown in a region free from the quantum dots 53. This allows one of the quantum dot sub-layers 52 to be formed. Thereafter, the crystal growth of a GaAs layer that is one of the barrier sub-layers 51 and the formation of one of the quantum dot sub-layers 52 are repeated.

Next, the emitter layer 6 is formed on the superlattice semiconductor layer 5. The emitter layer 6 may be a p-GaAs layer with a thickness of about 250 nm. This forms a pin structure.

Subsequently, the window layer 7 and the contact layers 8 are formed on the emitter layer 6 in that order. This forms a stack. The window layer 7 may be formed in such a manner that an n-$Al_{0.8}Ga_{0.2}As$ layer is crystallographically grown so as to have a thickness of about 50 nm. The contact layers 8 may be formed in such a manner that $p^+$-GaAs layers are crystallographically grown so as to have a thickness of about 200 nm.

Thereafter, the stack is taken out of the MBE system. Each of the p-type electrodes 9 is formed on a corresponding one of the contact layers 8 by photolithography and a lift-off technique. The contact layers 8 are selectively etched using the p-type electrodes 9 as masks.

On the lower surface (back surface) of the substrate 1, the wavelength conversion layers 11 and the metal films 12 are formed in that order by photolithography and a lift-off technique and the n-type electrodes 10 are also formed.

In the above manufacturing steps, for example, an n-type dopant used may be Si and a p-type dopant used may be Be. The p-type electrodes 9 and the n-type electrodes 10 may be made of Au and may be formed by vacuum vapor deposition using resistive heating.

In this embodiment, the solar cell 100 can be obtained by the above method.

Examples described in this embodiment are for exemplification only. That is, the followings are not limited to those described above: the substrate 1, the buffer layer 2, the BSF layer 3, the base layer 4, the superlattice semiconductor layer 5, the emitter layer 6, the window layer 7, the contact layers 8, the p-type electrodes 9, the n-type electrodes 10, the wavelength conversion layers 11, the metal films 12, materials such as the n-type dopant and the p-type dopant, the manufacturing method, and the like.

Experiment Example 1

A simulation experiment below was performed using the solar cell 100 manufactured in the above embodiment.

Evaluation Test

The miniband structure and light absorption spectrum of a superlattice were simulated by a plane-wave expansion method using an eight-band k·p Hamiltonian taking into account the influence of strain and a piezoelectric effect. The light absorption coefficient α can be estimated by solving the following equation:

$$\alpha(\omega) = \frac{e^2}{2n_r c_0 \epsilon_0 m_0^2 \omega L_x L_y} \int dK_z \sum_{a,b} |e \cdot p_{a,b}|^2 (f_a - f_b) G \quad (1)$$

where e is the elementary charge, $p_{a,b}$ is the matrix element, a and b are subband numbers, $n_r$ is the refractive index, $c_0$ is the speed of light, $\epsilon_0$ is the vacuum dielectric constant, $m_0$ is the mass of an electron, $L_x$ is the unit cell size in an x-direction (the (100) direction), $L_y$ is the unit cell size in a y-direction (the (010) direction), $K_z$ is the superlattice wave number, $f_i$(i=a, b) is the distribution function, G is the Gaussian broadening due to size variation and composition variation, and ω is the frequency of light.

For light absorption, an x-polarized wave (100) or a y-polarized wave (010) in the in-plane direction was defined as TE polarized light and a z-polarized wave (001) in the stacking direction was defined as TM polarized light.

In the calculation of the second light absorption spectrum (intersubband light absorption) in two-step light absorption, the ground level of the conduction band (or a superlattice miniband) was assumed to be filled with carriers and no carriers were assumed to be present in levels higher than the first excitation level of the conduction band (empty) (in Equation (1), $(f_a - f_b) = 1$).

In the superlattice semiconductor layer 5, the base semiconductor material used to form the barrier sub-layers 51 was gallium arsenide (GaAs) and the material used to form the quantum dots 53 was indium gallium arsenide (InAs). In this experiment example, the base semiconductor material was GaAs and the material used to form the quantum dots 53 was InAs. However, a mixed crystal material such as InGaAs or a different semiconductor material may be used.

In the superlattice semiconductor layer 5, the quantum dots 53 were lens-shaped and each included a wetting layer with a thickness of about 0.5 nm, the diameter of the quantum dots 53 in the in-plane direction was about 20 nm, and the size (height) of the quantum dots 53 in the stacking direction was about 8 nm. The distance between the quantum dots 53 in the in-plane direction was about 20 nm. The distance between the quantum dots 53 in the stacking direction was about 20 nm.

Figure 3:
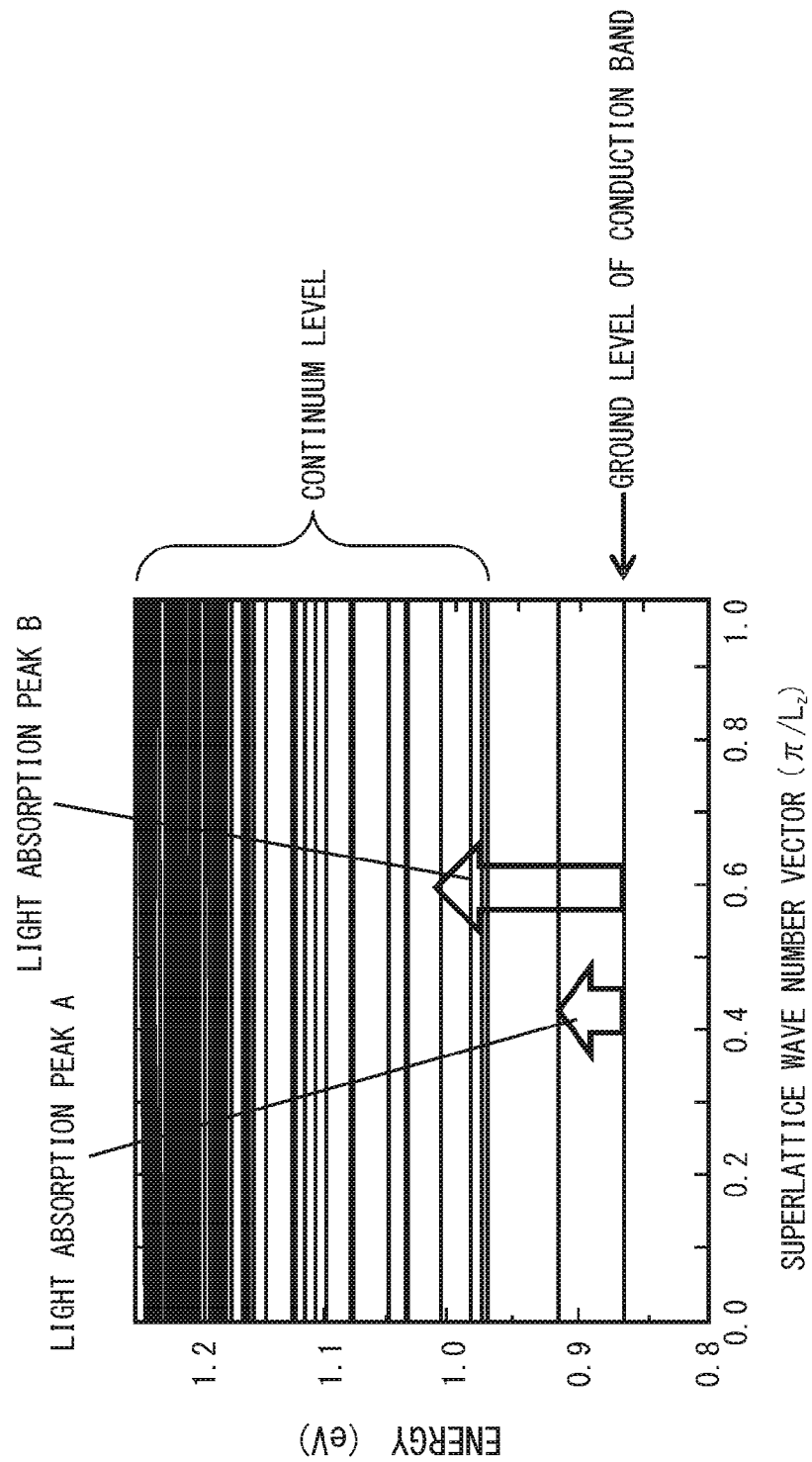
FIG. 3 is a graph showing the miniband structure of the conduction band of a superlattice semiconductor layer, the miniband structure being obtained by simulation in Experiment Example 1.

FIG. 3 is a graph showing the miniband structure of the conduction band of the superlattice semiconductor layer 5, the miniband structure being obtained by simulation in Experiment Example 1. In FIG. 3, the horizontal axis represents the superlattice wave number vector and the vertical axis represents the energy of light. The magnitude of energy was determined on the basis of the top of the valence band without taking into account the influence of strain in the material forming the quantum dots 53.

As shown in FIG. 3, in the conduction band of the superlattice semiconductor layer 5, the ground level of the conduction band (or the superlattice miniband) is about 0.865 eV and the continuum level is about 0.975 eV or more because the difference between levels greater than or equal to about 0.975 eV is up to about 30 meV and relaxation occurs quickly due to phonon scattering or the like.

Figure 4:
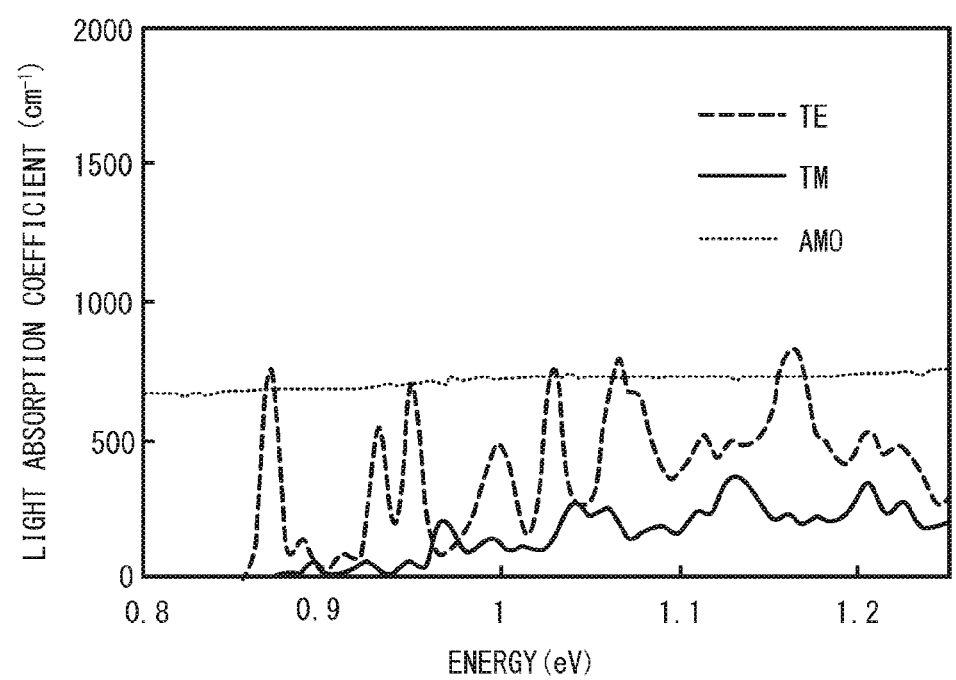
FIG. 4 is a graph showing a portion of the first light absorption spectrum in two-step light absorption of the superlattice semiconductor layer, the first light absorption spectrum being obtained by simulation in Experiment Example 1.
Figure 5:
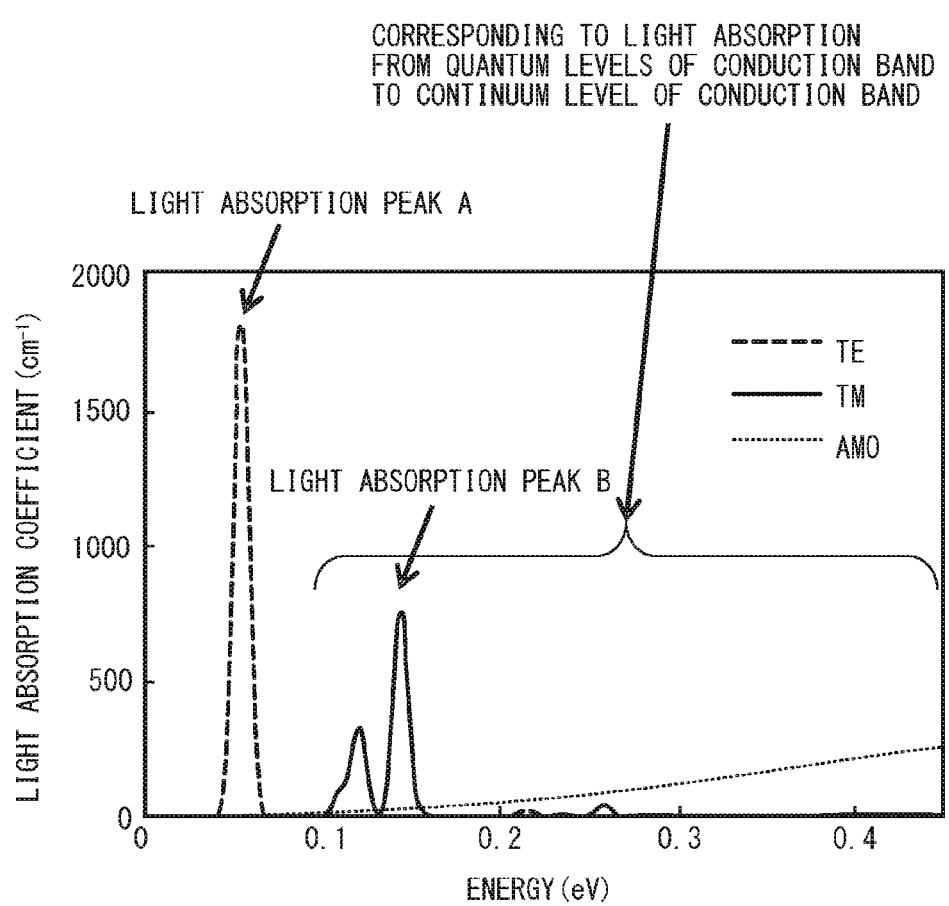
FIG. 5 is a graph showing the second light absorption spectrum in two-step light absorption of the superlattice semiconductor layer, the second light absorption spectrum being obtained by simulation in Experiment Example 1.

FIG. 4 shows a portion of the first light absorption spectrum in two-step light absorption of the superlattice semiconductor layer 5, the first light absorption spectrum being obtained by simulation in Experiment Example 1. FIG. 5 shows the second light absorption spectrum in two-step light absorption of the superlattice semiconductor layer 5, the second light absorption spectrum being obtained by simulation in Experiment Example 1. In each of FIGS. 4 and 5, the horizontal axis represents the energy of light, the vertical axis represents the light absorption coefficient, a dashed line represents the light absorption coefficient of TE polarized light, and a solid line represents the light absorption coefficient of TM polarized light.

The first light absorption spectrum shown in FIG. 4 has a sufficiently wide light absorption band as compared to the second light absorption spectrum shown in FIG. 5 and is good in matching to a sunlight spectrum. Therefore, it is clear that the first light absorption is sufficiently better than the second light absorption.

Referring to FIG. 5, an energy region greater than or equal to about 0.110 eV contains a plurality of light absorption peaks corresponding to light absorption from quantum levels of the conduction band of the superlattice semiconductor layer 5 to the continuum level of the conduction band.

In the solar cell 100, the wavelength conversion layers 11 convert incident light into light with an energy which is greater than or equal to about 0.110 eV and at which the light absorption coefficient peaks as shown in FIG. 5. The wavelength conversion layers 11 may convert incident light into light with an energy of about 0.143 eV, which corresponds to the maximum light absorption coefficient (the light absorption peak B) among light absorption coefficients that peak at about 0.110 eV or more. This allows carriers photoexcited from the ground level of the conduction band (or the superlattice miniband) to be readily extracted through electrodes and therefore allows the solar cell 100, which includes the superlattice semiconductor layer 5, to have increased photoelectric conversion efficiency.

As shown in FIG. 5, a light absorption coefficient peak (the light absorption peak A) having a light energy of about 0.054 eV is largest in the light absorption spectrum. Thus, matching the energy of light wavelength-converted by the wavelength conversion layers 11 to about 0.054 eV maximizes the light absorption of the superlattice semiconductor layer 5.

However, in carriers present in the ground level of the conduction band (or the superlattice miniband), photoexcitation due to light absorption results in that a transition level is energetically lower than the lower end of the conduction band of a barrier layer; hence, the extraction of carriers through electrodes needs further thermal excitation, photoexcitation, or the like (refer to FIG. 3). *Physical Review B*, vol. 82, p. 195321, 2010, which is a non-patent document, discloses fast relaxation due to electron-phonon scattering for $10^{-9}$ s to $10^{-12}$ s at about 36 meV. When quantum levels (including the superlattice miniband) are about 45 meV or more apart from each other, transitions between the quantum levels are probably unlikely to occur. In this configuration, in the first and second excitation levels at which transition is induced by light absorption at about 0.054 eV, the energy difference from the third excitation level located at the lower end of the continuum is about 56 meV and is sufficiently higher than LO phonon scattering energy (up to about 36 meV). Therefore, it is clear that the probability of transition due to thermal excitation is considerably low. That is, the extraction efficiency of carriers is remarkably low. Thus, the wavelength conversion layers 11 do not wavelength-convert incident light into 0.054 eV light corresponding to the light absorption peak A.

Experiment Example 2

In Experiment Example 2, simulation was performed by substantially the same method as that described in Experiment Example 1 except that the height of quantum dots 53 was changed. That is, the height of the quantum dots 53 was changed from the conditions described in Experiment Example 1.

As is the case with Experiment Example 1, in a superlattice semiconductor layer 5, a base semiconductor material used to form barrier sub-layers 51 was gallium arsenide (GaAs) and a material used to form quantum dots 53 was Indium arsenide (InAs). In this experiment example, the base semiconductor material was GaAs and the material used to form the quantum dots 53 was InAs. However, a mixed crystal material such as InGaAs or a different semiconductor material may be used.

In the superlattice semiconductor layer 5, the quantum dots 53 were lens-shaped and each included a wetting layer with a thickness of about 0.5 nm, the diameter of the quantum dots 53 in the in-plane direction was about 20 nm, and the size (height) of the quantum dots 53 in the stacking direction was about 4 nm. The distance between the quantum dots 53 in the in-plane direction was about 20 nm. The distance between the quantum dots 53 in the stacking direction was about 20 nm.

Figure 6:
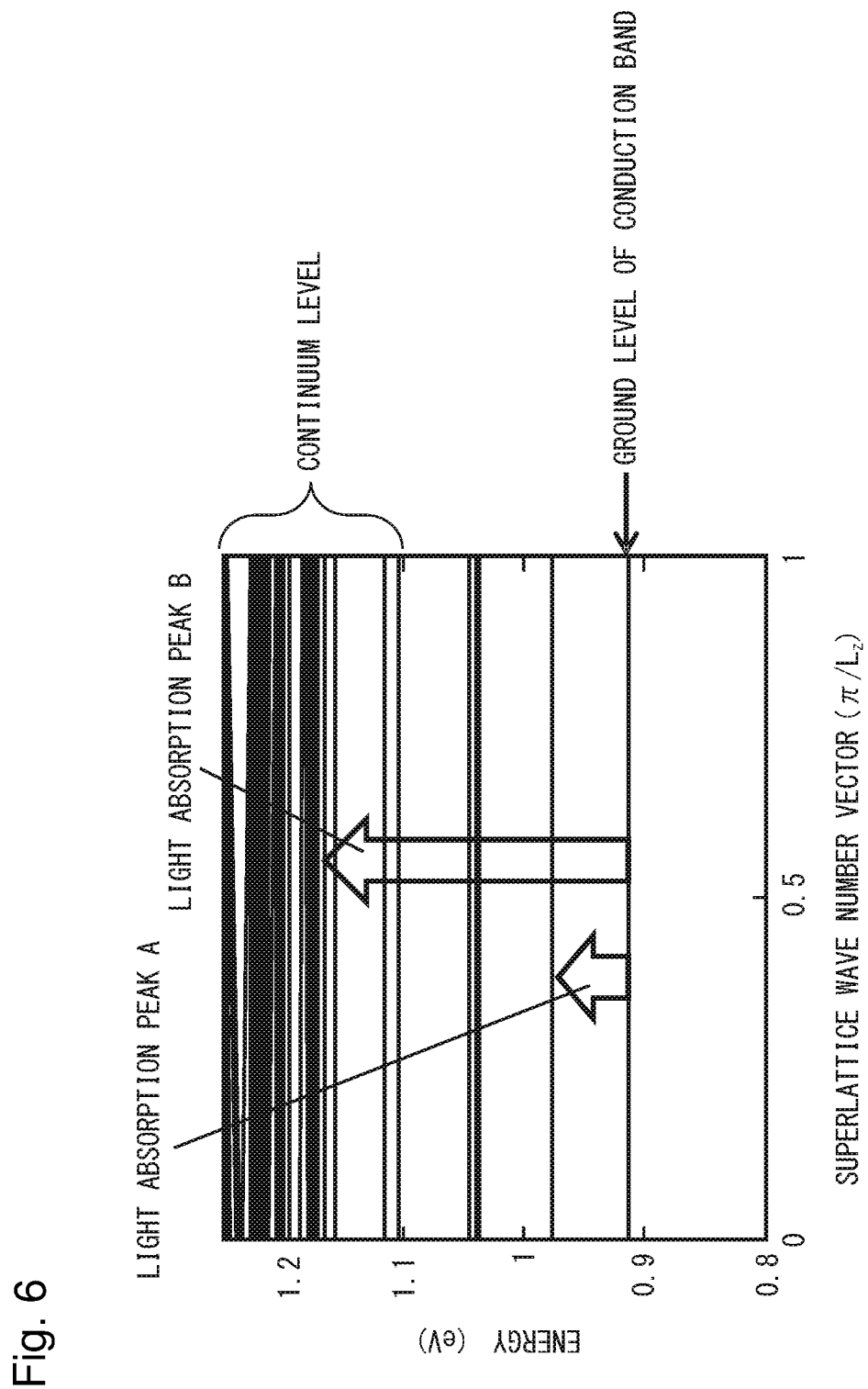
FIG. 6 is a graph showing the miniband structure of the conduction band of a superlattice semiconductor layer, the miniband structure being obtained by simulation in Experiment Example 2.

FIG. 6 is a graph showing the miniband structure of the conduction band of the superlattice semiconductor layer 5, the miniband structure being obtained by simulation in Experiment Example 2. In FIG. 6, the horizontal axis represents the superlattice wave number vector and the vertical axis represents the energy of light. The magnitude of the light energy was determined on the basis of the top of the valence band without taking into account the influence of strain in the material forming the quantum dots 53.

As shown in FIG. 6, in the conduction band of the superlattice semiconductor layer 5, the ground level of the conduction band (or a superlattice miniband) is about 0.912 eV and the continuum level is about 1.105 eV or more because the difference between levels greater than or equal to about 1.105 eV is up to about 38 meV and relaxation occurs quickly due to phonon scattering or the like.

Figure 7:
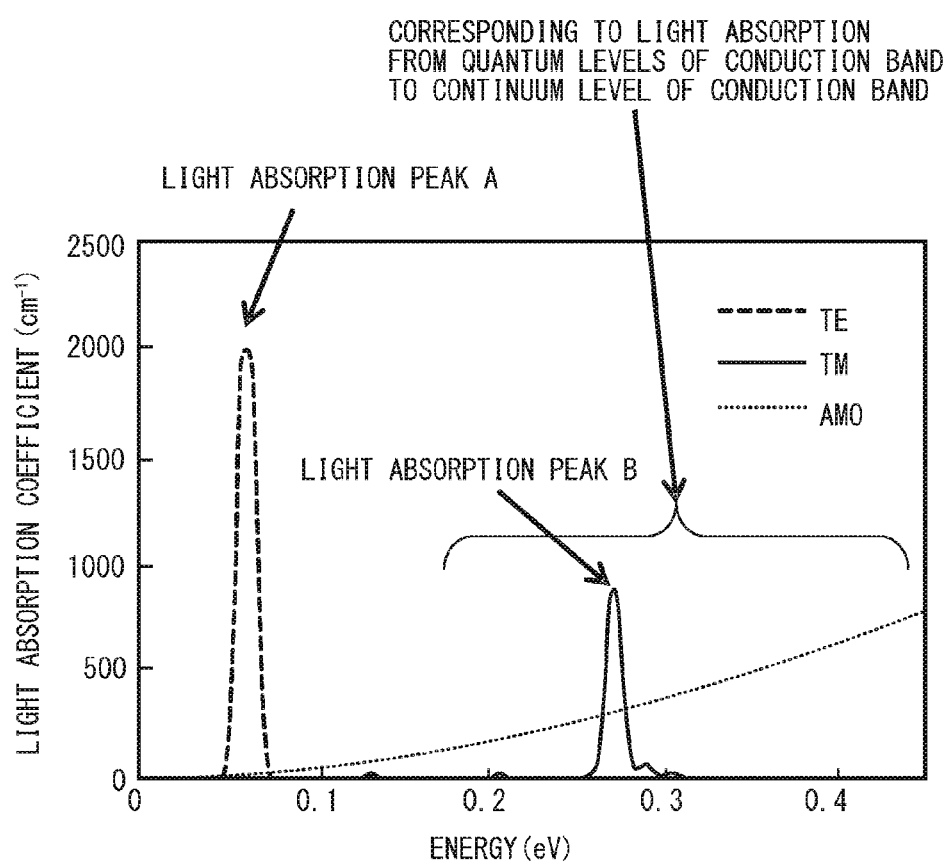
FIG. 7 is a graph showing the second light absorption spectrum in two-step light absorption of the superlattice semiconductor layer, the second light absorption spectrum being obtained by simulation in Experiment Example 2.

FIG. 7 shows the second light absorption spectrum in two-step light absorption of the superlattice semiconductor layer 5, the second light absorption spectrum being obtained by simulation in Experiment Example 2. In FIG. 7, the horizontal axis represents the energy of light, the vertical axis represents the light absorption coefficient, a dashed line represents the light absorption coefficient of TE polarized light, and a solid line represents the light absorption coefficient of TM polarized light.

Referring to FIG. 7, an energy region greater than or equal to about 0.193 eV contains a plurality of light absorption peaks corresponding to light absorption from quantum levels of the conduction band of the superlattice semiconductor layer 5 to the continuum level of the conduction band.

In this experiment example, wavelength conversion layers 11 convert incident light into light with an energy which is greater than or equal to about 0.193 eV and at which the light absorption coefficient peaks as shown in FIG. 7. The wavelength conversion layers 11 may convert incident light into light with an energy of about 0.273 eV, which corresponds to the maximum light absorption coefficient (a light absorption peak B) among light absorption coefficients that peak at about 0.193 eV or more. This allows carriers photoexcited from the ground level of the conduction band (or the superlattice miniband) to be readily extracted through electrodes and therefore allows a solar cell including the superlattice semiconductor layer 5 to have increased photoelectric conversion efficiency.

As shown in FIG. 7, a light absorption coefficient peak (a light absorption peak A) having a light energy of about 0.062 eV is largest in the light absorption spectrum. Thus, matching the energy of light wavelength-converted by the wavelength conversion layers 11 to about 0.062 eV maximizes the light absorption of the superlattice semiconductor layer 5.

However, in carriers present in the ground level of the conduction band (or the superlattice miniband), photoexcitation due to light absorption at 0.062 eV results in that a transition level is energetically lower than the lower end of the conduction band of a barrier layer; hence, the extraction of carriers through electrodes needs further thermal excitation, photoexcitation, or the like (refer to FIG. 6). In this configuration, in the first and second excitation levels at which transition is induced by light absorption at about 0.062 eV, the energy difference from the third excitation level is about 63 meV and is sufficiently higher than LO phonon scattering energy (up to about 36 meV). Therefore, it is clear that the probability of transition due to thermal excitation is considerably low. In the case where carriers are extracted by thermal excitation in this configuration, the extraction efficiency of the carriers is remarkably low because the energy difference between the third excitation level and a level located at the lower end of the continuum is about 60 meV. Thus, the wavelength conversion layers 11 do not wavelength-convert incident light into 0.062 eV light corresponding to the light absorption peak A.

Experiment Example 3

In Experiment Example 3, simulation was performed by substantially the same method as that described in Experiment Example 1 except that the distance between quantum dots 53 in a stacking direction was changed. That is, the distance between the quantum dots 53 in the stacking direction was changed from the conditions described in Experiment Example 1.

As is the case with Experiment Example 1, a superlattice semiconductor layer 5 was configured such that the quantum dots 53 were lens-shaped and each included a wetting layer with a thickness of about 0.5 nm, the diameter of the quantum dots 53 in the in-plane direction was about 20 nm, and the size (height) of the quantum dots 53 in the stacking direction was about 8 nm. The distance between the quantum dots 53 in the in-plane direction was about 20 nm. The distance between the quantum dots 53 in the stacking direction was about 4 nm.

Figure 8:
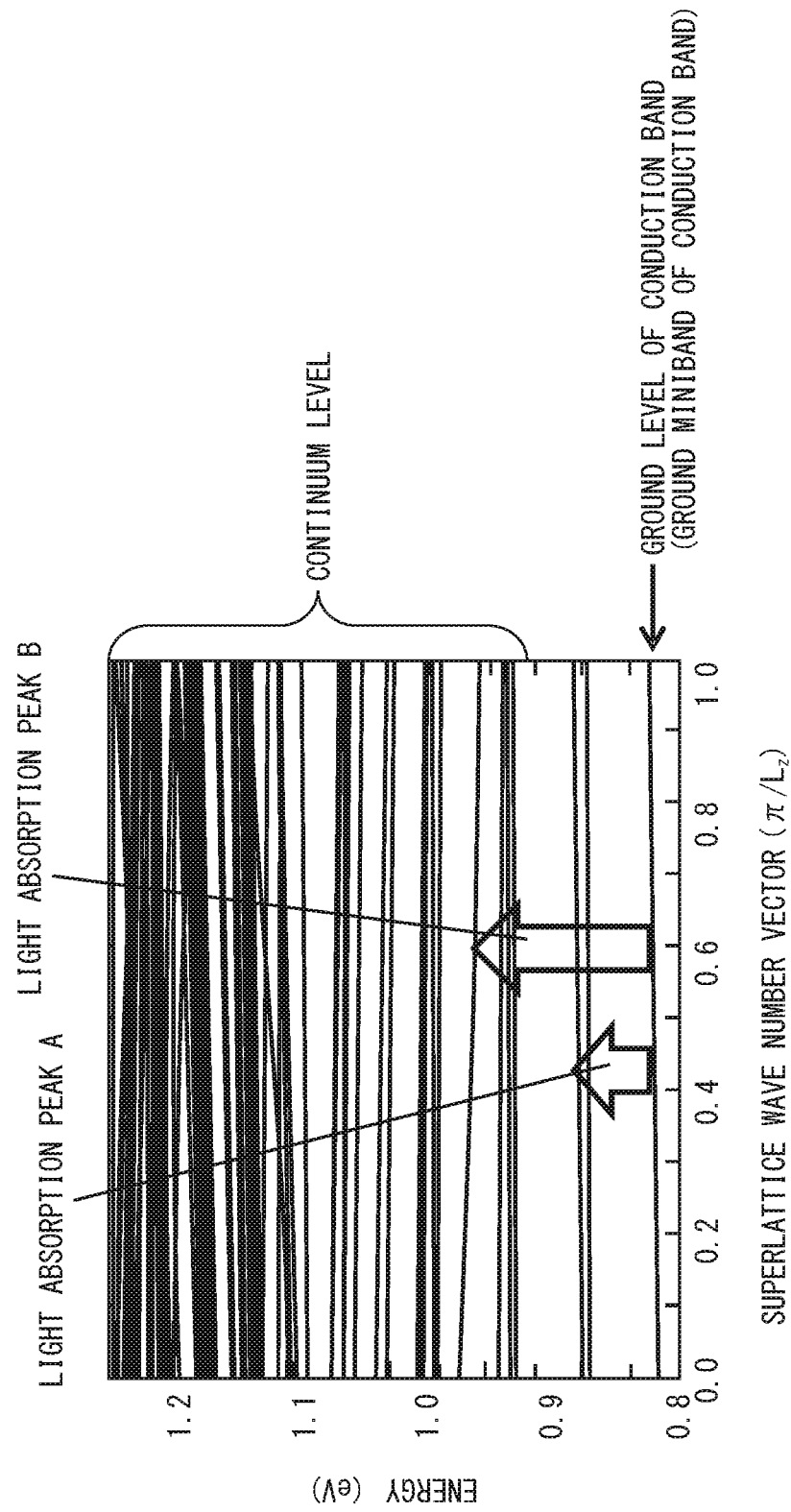
FIG. 8 is a graph showing the miniband structure of the conduction band of a superlattice semiconductor layer, the miniband structure being obtained by simulation in Experiment Example 3.

FIG. 8 is a graph showing the miniband structure of the conduction band of the superlattice semiconductor layer 5, the miniband structure being obtained by simulation in Experiment Example 3. In FIG. 8, the horizontal axis represents the superlattice wave number vector and the vertical axis represents the energy of light. The magnitude of the light energy was determined on the basis of the top of the valence band without taking into account the influence of strain in a material forming the quantum dots 53.

As shown in FIG. 8, in the conduction band of the superlattice semiconductor layer 5, the ground level of the conduction band (the ground miniband of the conduction band) is about 0.815 eV to 0.822 eV and the continuum level is about 0.928 eV or more because the difference between levels greater than or equal to about 0.928 eV is up to about 37 meV and relaxation occurs quickly in nanoseconds to picoseconds due to phonon scattering or the like.

Figure 9:
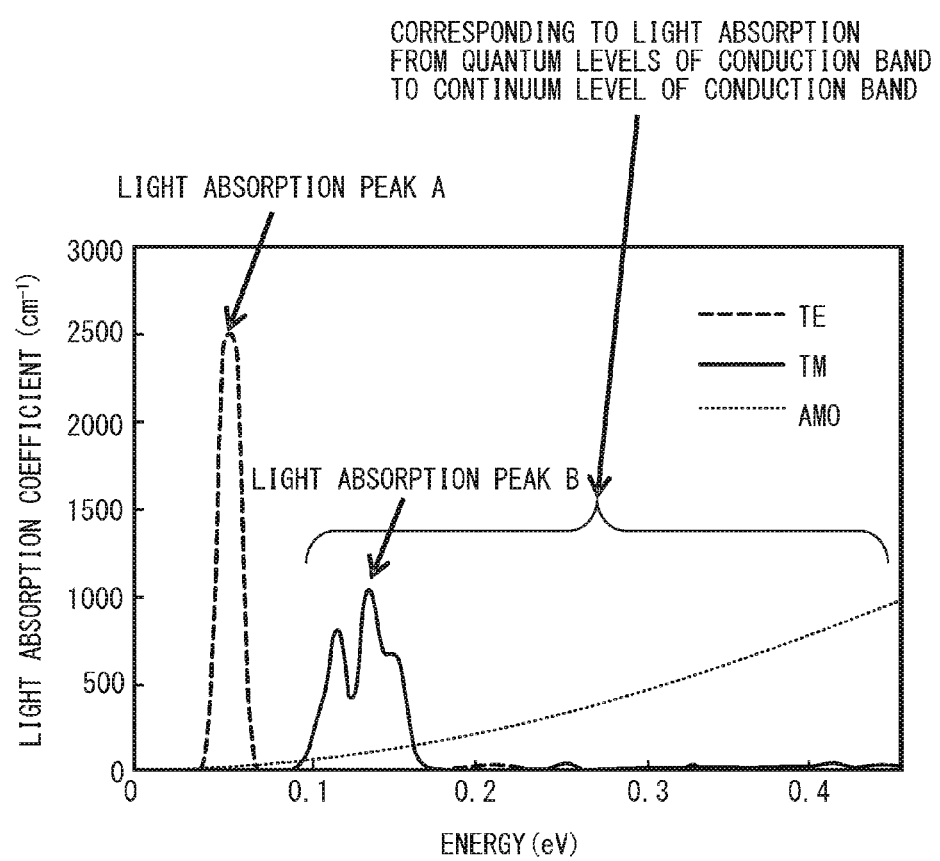
FIG. 9 is a graph showing a light absorption spectrum of the superlattice semiconductor layer that was obtained by simulation in Experiment Example 3.

FIG. 9 shows a light absorption spectrum of the superlattice semiconductor layer 5 that was obtained by simulation in Experiment Example 3. In FIG. 9, the horizontal axis represents the energy of light, the vertical axis represents the light absorption coefficient, a dashed line represents the light absorption coefficient of TE polarized light, and a solid line represents the light absorption coefficient of TM polarized light.

Referring to FIG. 9, an energy region greater than or equal to about 0.113 eV contains a plurality of light absorption peaks corresponding to light absorption from quantum levels of the conduction band of the superlattice semiconductor layer 5 to the continuum level of the conduction band.

In this experiment example, wavelength conversion layers 11 convert incident light into light with an energy which is greater than or equal to about 0.113 eV and at which the light absorption coefficient peaks as shown in FIG. 9. The wavelength conversion layers 11 may convert incident light into light with an energy of about 0.139 eV, which corresponds to the maximum light absorption coefficient (a light absorption peak B) among light absorption coefficients that peak at about 0.113 eV or more. This allows carriers photoexcited from the ground level of the conduction band (the ground miniband of the conduction band) to be readily extracted through electrodes and therefore allows a solar cell including the superlattice semiconductor layer 5 to have increased photoelectric conversion efficiency.

As shown in FIG. 9, a light absorption coefficient peak (a light absorption peak A) having a light energy of about 0.055 eV is largest in the light absorption spectrum. Thus, matching the energy of light wavelength-converted by the wavelength conversion layers 11 to about 0.055 eV maximizes the light absorption of the superlattice semiconductor layer 5.

However, in carriers present in the ground level of the conduction band (the ground miniband of the conduction band), photoexcitation due to light absorption at 0.055 eV results in that a transition level is energetically lower than the lower end of the conduction band of a barrier layer; hence, the extraction of carriers through electrodes needs further thermal excitation, photoexcitation, or the like (refer to FIG. 8). In this configuration, in the first and second excitation levels at which transition is induced by light absorption at about 0.055 eV, the energy difference from the third excitation level located at the lower end of the continuum is about 47 meV and is sufficiently higher than LO phonon scattering energy (up to about 36 meV). Therefore, it is clear that the probability of transition due to thermal excitation is considerably low. That is, the extraction efficiency of carriers is remarkably low. Thus, the wavelength conversion layers 11 do not wavelength-convert incident light into 0.055 eV light corresponding to the light absorption peak A.

Experiment Example 4

In Experiment Example 4, simulation was performed by substantially the same method as that described in Experiment Example 1 except that a base semiconductor material forming barrier sub-layers 51, the height of quantum dots 53, and the distance between the quantum dots 53 in the stacking direction were changed.

In a superlattice semiconductor layer 5, a base semiconductor material used to form barrier sub-layers 51 was indium gallium arsenide (InGaAs) and a material used to form quantum dots 53 was Indium arsenide (InAs). In this experiment example, the base semiconductor material was InGaAs. However, a different composition or a mixed crystal material such as AlGaAs, InAlAs, GaAsP, or AlInP may be used. The material used to form the quantum dots 53 was InAs. However, a mixed crystal material such as InGaAs or a different semiconductor material may be used.

In the superlattice semiconductor layer 5, the quantum dots 53 were lens-shaped and each included a wetting layer with a thickness of about 0.5 nm, the diameter of the quantum dots 53 in the in-plane direction was about 20 nm, and the size (height) of the quantum dots 53 in the stacking direction was about 4 nm. The distance between the quantum dots 53 in the in-plane direction was about 20 nm. The distance between the quantum dots 53 in the stacking direction was about 4 nm.

Figure 10:
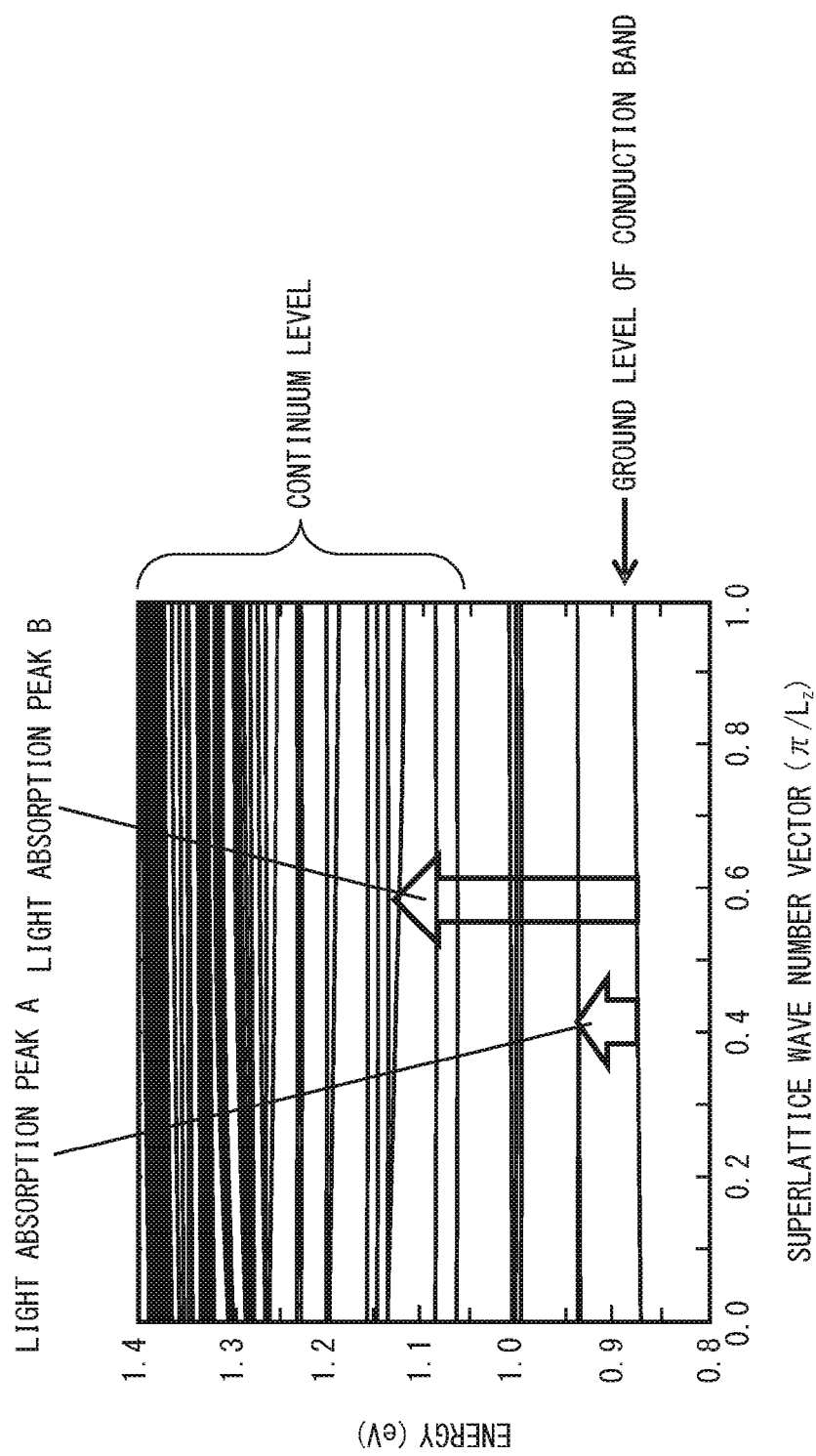
FIG. 10 is a graph showing the miniband structure of the conduction band of a superlattice semiconductor layer, the miniband structure being obtained by simulation in Experiment Example 4.

FIG. 10 is a graph showing the miniband structure of the conduction band of the superlattice semiconductor layer 5, the miniband structure being obtained by simulation in Experiment Example 4. In FIG. 10, the horizontal axis represents the superlattice wave number vector and the vertical axis represents the energy of light. The magnitude of the light energy was determined on the basis of the top of the valence band without taking into account the influence of strain in the material forming the quantum dots 53.

As shown in FIG. 10, in the conduction band of the superlattice semiconductor layer 5, the ground level of the conduction band (or a superlattice miniband) is about 0.870 eV and the continuum level is about 1.065 eV or more because the difference between levels greater than or equal to about 1.065 eV is up to about 33 meV and relaxation occurs quickly due to phonon scattering or the like.

Figure 11:
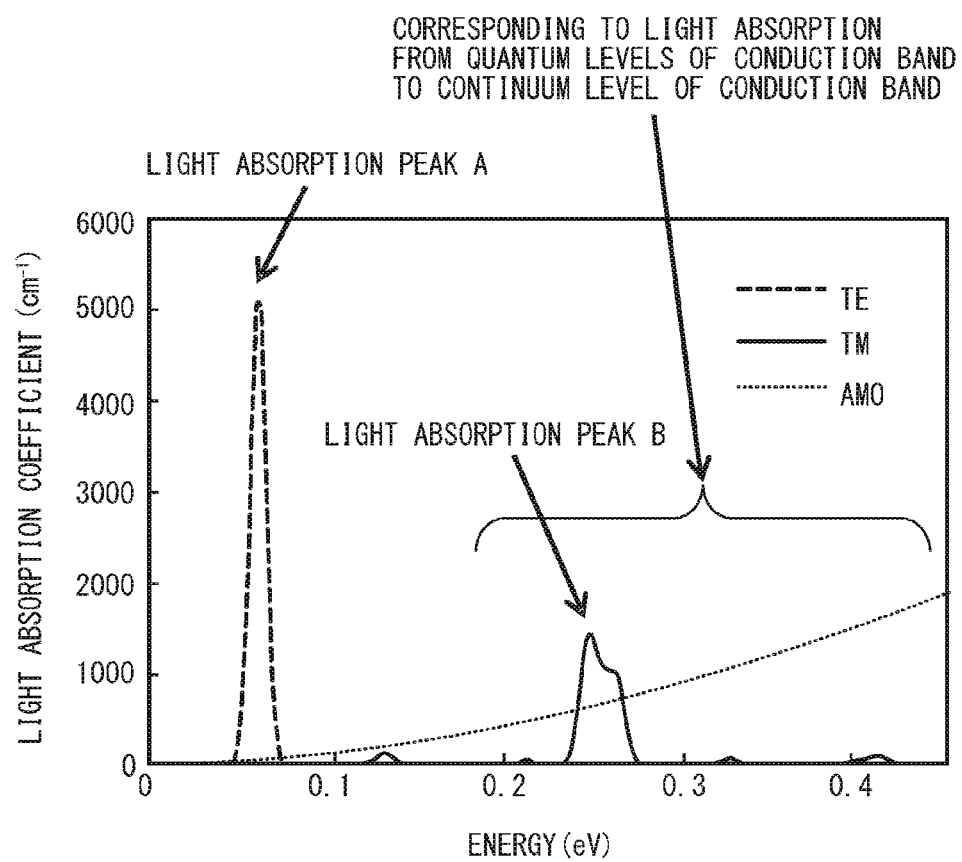
FIG. 11 is a graph showing a light absorption spectrum of the superlattice semiconductor layer that was obtained by simulation in Experiment Example 4.

FIG. 11 shows a light absorption spectrum of the superlattice semiconductor layer 5 that was obtained by simulation in Experiment Example 4. In FIG. 11, the horizontal axis represents the energy of light, the vertical axis represents the light absorption coefficient, a dashed line represents the light absorption coefficient of TE polarized light, and a solid line represents the light absorption coefficient of TM polarized light.

Referring to FIG. 11, an energy region greater than or equal to about 0.195 eV contains a plurality of light absorption peaks corresponding to light absorption from quantum levels of the conduction band of the superlattice semiconductor layer 5 to the continuum level of the conduction band.

In this experiment example, wavelength conversion layers 11 convert incident light into light with an energy which is greater than or equal to about 0.195 eV and at which the light absorption coefficient peaks as shown in FIG. 11. The wavelength conversion layers 11 may convert incident light into light with an energy of about 0.249 eV, which corresponds to the maximum light absorption coefficient (a light absorption peak B) among light absorption coefficients that peak at about 0.195 eV or more. This allows carriers photoexcited from the ground level of the conduction band (or a superlattice miniband) to be readily extracted through electrodes and therefore allows a solar cell including the superlattice semiconductor layer 5 to have increased photoelectric conversion efficiency.

As shown in FIG. 11, a light absorption coefficient peak (a light absorption peak A) having a light energy of about 0.062 eV is largest in the light absorption spectrum. Thus, matching the energy of light wavelength-converted by the wavelength conversion layers 11 to about 0.062 eV maximizes the light absorption of the superlattice semiconductor layer 5.

However, in carriers present in the ground level of the conduction band (or the superlattice miniband), photoexcitation due to light absorption at 0.062 eV results in that a transition level is energetically lower than the lower end of the conduction band of a barrier layer; hence, the extraction of carriers through electrodes needs further thermal excitation, photoexcitation, or the like (refer to FIG. 10). In this configuration, in the first and second excitation levels at which transition is induced by light absorption at about 0.062 eV, the energy difference from the third excitation level is about 61 meV and is sufficiently higher than LO phonon scattering energy (up to about 36 meV). Therefore, it is clear that the probability of transition due to thermal excitation is considerably low. In the case where carriers are extracted by thermal excitation in this configuration, the extraction efficiency of the carriers is remarkably low because the energy difference between the third excitation level and a level located at the lower end of the continuum is about 70 meV. Thus, the wavelength conversion layers 11 do not wavelength-convert incident light into 0.062 eV light corresponding to the light absorption peak A.

Configurational Modification 1 of Solar Cell

A solar cell may be one transferred to a substrate. For example, a flexible solar cell can be obtained by transfer to a flexible substrate.

In particular, an epitaxial layer grown on a substrate is separated from the substrate and is then transferred onto a flexible substrate provided with a wavelength conversion layer and an electrode layer. The wavelength conversion layer and the electrode layer may be formed after transfer. This configuration allows a highly flexible solar cell to be obtained. This configuration leads to the simplification of a manufacturing process, enables an epitaxial growth substrate to be reused, and leads to a reduction in cost.

A substrate for transfer need not be a flexible substrate and may be metal foil or the like. No substrate may be present. In the case where metal foil is used as a substrate for transfer, a wavelength conversion layer may be placed on a light incident-side side with respect to a photoelectric conversion layer.

Configurational Modification 2 of Solar Cell

A solar cell may be combined with a photoluminescent converter. The photoluminescent converter is a configuration containing a wavelength conversion material and is a molded body obtained by mixing the wavelength conversion material with glass, resin, or the like for the purpose of fixing the wavelength conversion material. For example, the following configuration is prepared: a configuration in which a photoelectric conversion layer is placed on a side surface of a photoluminescent converter including a wavelength conversion layer made of one or more wavelength conversion materials. Sunlight incident on the wavelength conversion layer is collected, is wavelength-converted, and is then incident on the photoelectric conversion layer. This allows the increase in photoelectric conversion efficiency of the solar cell to be expected.

In this photoluminescent converter, sunlight incident on the front surface thereof repeatedly undergoes wavelength conversion and radiation in an inner portion of this photoluminescent converter and further undergoes total reflection on the front surface and back surface thereof and collected and wavelength-converted sunlight finally leaves four edge surfaces of this photoluminescent converter. The photoelectric conversion efficiency of the solar cell can be increased by placing a photoelectric conversion layer on each of the four edge surfaces of this photoluminescent converter. According to this configuration, the solar cell can be configured with usage corresponding to an edge area and therefore the amount and cost of a material used can be reduced. The weight reduction of the solar cell allows the solar cell to be used regardless of location. That is, the solar cell can be attached to a window or a building material or can be mounted on a roof or the like.

Quantum-Type Infrared Sensor

A quantum-type infrared sensor is known to detect an infrared beam by exciting carriers with the energy of an infrared photon. A photoelectric conversion element according to an embodiment of the present disclosure can be used in the quantum-type infrared sensor. The photoelectric conversion element includes a p-type semiconductor layer, an n-type semiconductor layer, a superlattice semiconductor layer which is interposed between the p-type semiconductor layer and the n-type semiconductor layer and which includes barrier sub-layers and quantum sub-layers alternately stacked, and a wavelength conversion layer containing a wavelength conversion material converting the wavelength of incident light. The wavelength conversion layer converts incident light into light with an energy at which a photocurable composition peaks among energies corresponding to optical transitions from quantum levels of the conduction band of the superlattice semiconductor layer to a continuum level of the conduction band. The photoelectric conversion element may include another n-type semiconductor layer instead of the p-type semiconductor layer such that the superlattice semiconductor layer is interposed between the n-type semiconductor layers.

In the quantum-type infrared sensor, carriers excited by infrared absorption may be extracted from a quantum level of the conduction band with high efficiency for the purpose of allowing the quantum-type infrared sensor to have high quantum efficiency and high sensitivity.

As described above, the photoelectric conversion element can extract photoexcited carriers with high efficiency. That is, the energy of sensed light is matched to the energy of light that allows the light absorption coefficient to peak in response to an optical transition from a quantum level of the conduction band of the superlattice semiconductor layer to a continuum level of the conduction band. This configuration allows high quantum efficiency and high sensitivity to be achieved.

The present disclosure is not limited to the above embodiments. In order to efficiently induce the second light absorption in two-step light absorption, a photoelectric conversion element according to an embodiment of the present disclosure may have a configuration which includes a superlattice semiconductor layer including barrier sub-layers and quantum sub-layers alternately stacked and a wavelength conversion layer containing a wavelength conversion material converting the wavelength of incident light and in which the wavelength conversion layer converts incident light into light with a wavelength corresponding to an optical transition from a quantum level of the conduction band of the superlattice semiconductor layer to a continuum level of the conduction band. In particular, the wavelength conversion layer may convert incident light into light with an energy at which a light absorption coefficient peaks in response to an optical transition from a quantum level of the conduction band of the superlattice semiconductor layer to a continuum level of the conduction band in a light absorption spectrum showing the relationship between the energy of light and the light absorption coefficient.

The wavelength conversion layer may convert incident light into light with an energy at which the light absorption coefficient is largest among light energies at which the light absorption coefficient peaks in response to the optical transition from the quantum level of the conduction band of the superlattice semiconductor layer to the continuum level of the conduction band in the light absorption spectrum. The wavelength conversion layer may convert incident light into, for example, light with an energy at which the light absorption coefficient is second largest or third largest.

In the above embodiment, the base layer 4 is an n-type semiconductor layer and the emitter layer 6 is a p-type semiconductor layer as described above. The base layer 4 may be a p-type semiconductor layer and the emitter layer 6 may be an n-type semiconductor layer.

The present disclosure contains subject matter related to that disclosed in Japanese Priority Patent Application JP 2015-112452 filed in the Japan Patent Office on Jun. 2, 2015, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A photoelectric conversion element comprising:
a superlattice semiconductor layer including barrier sub-layers and quantum sub-layers alternately stacked; and
a wavelength conversion layer containing a wavelength conversion material converting the wavelength of incident light,
wherein the wavelength conversion layer converts incident light into light with a wavelength corresponding to an optical transition from a quantum level of the conduction band of the superlattice semiconductor layer to a continuum level of the conduction band.

2. The photoelectric conversion element according to claim 1, wherein the wavelength conversion layer converts incident light into light with an energy at which a light absorption coefficient peaks in response to the optical transition from the quantum level of the conduction band of the superlattice semiconductor layer to the continuum level of the conduction band in a light absorption spectrum showing the relationship between the energy of light and the light absorption coefficient.

3. The photoelectric conversion element according to claim 2, wherein the wavelength conversion layer converts incident light into light with an energy at which the light absorption coefficient is largest among energies at which the light absorption coefficient peaks in response to optical transitions from quantum levels of the conduction band of the superlattice semiconductor layer to the continuum level of the conduction band in the light absorption spectrum.

4. The photoelectric conversion element according to claim 1, wherein the wavelength conversion layer is placed opposite a light-incident side with respect to the superlattice semiconductor layer.

5. The photoelectric conversion element according to claim 4, further comprising a reflective film which is placed opposite the light-incident side with respect to the wavelength conversion layer and which reflects light.

6. The photoelectric conversion element according to claim 1, wherein the quantum sub-layers are quantum dot layers having a structure in which a plurality of quantum dots are surrounded by the barrier sub-layers.

7. The photoelectric conversion element according to claim 1, wherein the wavelength conversion material contains quantum dots.

8. The photoelectric conversion element according to claim 1, wherein the wavelength conversion layer includes a plurality of sub-layers which convert incident light into light with a shorter wavelength and which contain different types of wavelength conversion materials.

9. The photoelectric conversion element according to claim 8, wherein at least one of the sub-layers included in the wavelength conversion layer converts incident light into light with an energy at which a light absorption coefficient peaks in response to an optical transition from a quantum level of the valence band of the superlattice semiconductor layer to a continuum level of the valence band in a light absorption spectrum showing the relationship between the energy of light and the light absorption coefficient.

* * * * *